(12) United States Patent
Chidambarrao et al.

(10) Patent No.: US 7,683,428 B2
(45) Date of Patent: Mar. 23, 2010

(54) VERTICAL FIN-FET MOS DEVICES

(75) Inventors: Dureseti Chidambarrao, Weston, CT (US); Jochen Beintner, Gomadingen (DE); Ramachandra Divakaruni, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/597,288

(22) PCT Filed: Jan. 22, 2004

(86) PCT No.: PCT/US2004/001721

§ 371 (c)(1),
(2), (4) Date: Jul. 19, 2006

(87) PCT Pub. No.: WO2005/079182

PCT Pub. Date: Sep. 1, 2005

(65) Prior Publication Data

US 2009/0200604 A1   Aug. 13, 2009

(51) Int. Cl.
*H01L 27/108* (2006.01)
(52) U.S. Cl. .................. 257/347; 257/328; 257/302; 257/E27.055; 438/254; 438/396; 438/253
(58) Field of Classification Search .................. 257/347, 257/328, 302, E27.055; 438/254, 396, 253
See application file for complete search history.

(56) References Cited

U.S. PATENT DOCUMENTS

| 5,072,269 | A | 12/1991 | Hieda |
| 5,414,289 | A * | 5/1995 | Fitch et al. ............... 257/329 |
| 6,238,976 | B1 * | 5/2001 | Noble et al. .............. 438/259 |
| 6,680,508 | B1 * | 1/2004 | Rudeck ..................... 257/316 |
| 6,855,582 | B1 | 2/2005 | Dakshina-Murthy et al. |
| 2002/0140032 | A1 | 10/2002 | Cho et al. |

OTHER PUBLICATIONS

"Sub-50 nm P-Channel FinFET" Huang et al. IEEE Transactions on Electron Devices. vol. 48, No. 5, May 2001.*

* cited by examiner

*Primary Examiner*—Davienne Monbleau
*Assistant Examiner*—Kenneth Hamlin
(74) *Attorney, Agent, or Firm*—H. Daniel Schnurmann (57) ABSTRACT

A new class of high-density, vertical Fin-FET devices that exhibit low contact resistance is described. These vertical Fin-FET devices have vertical silicon "fins" (12A) that act as the transistor body. Doped source and drain regions (26A, 28A) are formed at the bottoms and tops, respectively, of the fins (12A). Gates (24A, 24B) are formed along sidewalls of the fins. Current flows vertically through the fins (12A) between the source and drain regions (26A, 28A) when an appropriate bias is applied to the gates (24A, 24B). An integrated process for forming pFET, nFET, multi-fin, single-fin, multi-gate and double-gate vertical Fin-FETs simultaneously is described.

21 Claims, 9 Drawing Sheets

VERTICAL FIN-FET MOS DEVICES

TECHNICAL FIELD OF THE INVENTION

The present invention relates generally to semiconductor devices, more particularly to MOSFET (Metal-Oxide-Semiconductor Field Effect Transistor) devices, and still more particularly to vertical MOSFETs.

BACKGROUND OF THE INVENTION

In 1965, Dr. Gordon Moore, then Director of Research and Development for Fairchild Semiconductor, made the observation that the number of transistor devices per integrated circuit had been doubling every couple of years since the creation of the first integrated circuits in the late 1950's and that he expected the trend to continue for the foreseeable future. This observation was dubbed "Moore's Law" by the trade press. Now almost 40 years later, despite numerous dire predictions of fundamental obstacles, unrelenting industry efforts towards every-increasing semiconductor density have effectively affirmed Dr. Moore's prophetic observation, and the trend is still expected to continue unabated for the foreseeable future. The process of reducing semiconductor device size to increase integrated circuit density is generally referred to as "scaling".

Ongoing scaling efforts of semiconductor MOS (Metal-Oxide-Semiconductor) devices not only contribute to higher integrated circuit packing density, but also improve integrated circuit performance. As the scaling process proceeds towards the physical limits of currently available MOS technologies and techniques, new technologies and techniques are developed to further decrease device size and increase device performance. As MOS device size decreases, tremendous challenges arise in a variety of areas, including source/drain contact resistance and current carrying capacity. In these two areas at least, extremely small size tends to work against performance.

One approach that has been employed to improve current carrying capacity of extremely small-geometry FETs is the creation of "double gate" (also referred to as dual-gate herein) transistors. In principle, double-gate transistors act something like two transistors in parallel, thereby improving current flow between source and drain. Two major types of double-gate transistors have been demonstrated: the planar double-gate transistor and the double-gate Fin-FET.

The planar double-gate FET is not unlike a conventional single gate transistor in that it has a horizontal "planar" transistor body with a source and drain at each end and a channel therebetween. Unlike single-gate transistors, however, the planar double-gate FET has a second gate below the transistor body effectively creating a second, parallel channel between the source and drain. However, there is considerable process complexity involved in forming the second, buried gate and in connecting to it, and the planar double-gate transistor is not significantly different from conventional planar transistor structures in terms of its ability to be scaled. Such planar devices are rapidly approaching the physical limits of scaling.

The double-gate Fin-FET employs thin vertical silicon "fins" that act as the transistor body. Horizontally opposed ends of the fin act as source and drain. The gate structure is formed around the fin in an inverted "U" configuration such that the fin has parallel gates formed along both vertical sidewalls thereof. As in the planar double-gate transistor, the double-gate Fin-FET improves current flow between source and drain by effectively creating parallel channels therebetween. Current flows horizontally through the fin between source and drain when the double gate is appropriately biased. Because the transistor body of the Fin-FET is a thin vertical structure, there can be considerable space savings over similar planar devices. Series resistance in Fin-FETs is a significant problem, however.

SUMMARY OF THE INVENTION

The present inventive technique produces high-density, vertical Fin-FET devices with low contact resistance by means of vertical silicon "fins" that act as the transistor body. Doped source and drain regions are formed at the bottoms and tops, respectively, of the fins. Gate structures are formed along sidewalls of the fins, spanning the vertical distance between the source and drain regions and separated from the fins by thin gate insulators. Current flows vertically through the channel region between the source and drain regions when an appropriate bias is applied to the gates. Through the use of selective doping, both nFET and pFET variants of the inventive vertical Fin-FET device are easily formed on the same substrate. Preferably, the substrate is an SOI (silicon-on-insulator) wafer, but any suitable substrate or portion thereof having a silicon layer formed over an insulator layer (e.g., buried oxide layer—"BOX") could be employed.

The basic structure of the inventive vertical Fin-FET device is characterized by at least one vertical semiconductor fin disposed on an insulator layer. Doped source and drain regions are formed in bottom and top portions of the fin(s) and gate conductors are disposed along vertical sidewalls of the at least one semiconductor fin. The gate conductors are space away from the fins by thin gate insulators.

According to an aspect of the invention, the gate conductors span a vertical distance between the source region and drain region of the fin(s). Since gate conductors are disposed on both sides of the fin(s), the vertical Fin-FET is essentially a dual-gate device. When an appropriate biasing voltage is applied to the gate conductors, channels form between the source and drain regions adjacent to each gate, effectively creating parallel channels and improving the current carrying capacity of the vertical Fin-FET as compared to single-gate devices.

Generally speaking, source conductors contact the source regions on both sides of the fins. Source contacts (typically metal) are employed to connect to the source conductors, drain contacts connect to the drain regions and gate contacts connect to the gate conductors.

According to an aspect of the invention, the gate connections can be made either separately or in common. Providing separate gate contacts that connect to the gate conductors on opposite sides of a fin yields a multi-gate vertical Fin-FET whereby each of the gates can be separately controlled. Connecting to the gate conductors on opposite sides of a fin in parallel with a single gate contact yields a double-gate vertical Fin-FET with enhanced drive capability.

According to another aspect of the invention, the source contact can connect to the source conductor on one side of the fin only in a "single-source" variant of the vertical Fin-FET.

Multi-Fin versions of the vertical fin-FET are readily formed by creating multiple fins and connecting them in parallel such that the source conductors are all connected together, the drain regions are all connected together and the gate conductors are all connected together. Alternatively, the gates can be connected such that two gate contacts are provided where one gate contact connects to all of the gate conductors on one side of each fin and the other gate contact connects to all of the gate conductors on the other side of each fin.

According to another aspect of the invention, a "fat-drain" variation improves drain contact resistance. In this variation, the drain contact is "widened" to over extend the fin laterally.

By selective doping, nFET and pFET devices are readily created on the same substrate. For nFET devices, the source regions, drain regions, gate conductors and source conductors are all n+ doped. For pFET devices, the source regions, drain regions, gate conductors and source conductors are all p+ doped.

Any number of pFET and/or nFET devices can be created, and multi-Fin devices can be created using the same process steps as single-fin devices. This permits any combination of single-fin and/or multi-fin pFET and/or nFET devices to be formed on a single substrate using essentially the same process steps. These devices can be parts of CMOS circuits or non-complementary circuits and can be part of a large integrated circuit device.

One suitable method for forming the vertical fin-FET device can be summarized as a series of processing steps as follows:

(1) provide a semiconductor substrate having a semiconductor layer disposed over an insulator layer;
(2) form vertical semiconductor fins on top of the insulator layer by etching parallel trenches through the semiconductor layer down to the insulator layer;
(3) selectively deposit doped source conductors at the bottoms of the trenches such that the doped conductors contact bottom portions of the fins;
(4) form source insulators over the doped conductors;
(5) form gate insulators along sidewalls of the trenches;
(6) thermally drive dopants from the doped conductors into bottom portions of the fins to create source regions;
(7) form gate conductors along vertical sidewalls of the fins spaced away the fins by the gate insulators;
(8) dope top portions of the fins to form drain regions therein;
(9) form sidewall spacers along exposed sidewalls of the trenches, fins and gate conductors;
(10) etch back the source insulators to expose the underlying doped source conductors;
(11) form silicide in exposed portions of the source and gate conductors;
(12) fill the trenches with an oxide trench-fill and planarize;
(13) form metal source, drain and gate contacts by Damascene processes of selective etching, metal fill, and chem-mech polishing.

BRIEF DESCRIPTION OF THE DRAWINGS

These and further features of the present invention will be apparent with reference to the following description and drawing, wherein.

DETAILED DESCRIPTION OF THE INVENTION

The present inventive technique produces high-density, vertical Fin-FET devices with low contact resistance by forming tall, thin vertical silicon "fins" that act as the transistor body. Appropriately doped source and drain regions are formed at the bottoms and tops, respectively, of the fins and gate structures are formed along sidewalls of the fins, overlapping the doped source and drain regions, thereby creating a vertical channel region in the fin between the source and drain regions. Current flows vertically through channels that form in the channel region adjacent to the gate structures and extending between the source and drain regions when an appropriate bias is applied to the gates. Through the use of selective doping, both nFET and pFET variants of the inventive vertical Fin-FET device are easily formed on the same substrate. Preferably, the substrate is an SOI (silicon-on-insulator) wafer, but any suitable substrate or portion thereof having a silicon layer formed over an insulator layer (e.g., buried oxide layer—"BOX") could be employed. Preferably, an SOI substrate having a nitride layer overlying a silicon layer that in turn overlies a buried oxide layer (BOX) is employed.

A preferred embodiment of a method for forming vertical Fin-FET semiconductor structures can be summarized as: (1) Forming tall, thin vertical semiconductor (silicon) "fins" on top of an insulator layer in a suitable substrate (e.g. SOI), e.g., by etching parallel trenches through the silicon layer down to the insulator layer (e.g, BOX); (2) selectively depositing n+ and/or p+ doped polysilicon conductors at the bottoms of the trenches (as appropriate to the type of FinFET devices being formed: nFET and/or pFET) such that the doped polysilicon conductors contact bottom portions of the fins; (3) forming an HDP oxide insulating layer over the polysilicon; (4) effecting appropriate channel doping (in the "fin") using conventional masking and implantation techniques; (5) forming gate insulators along sidewalls of the trenches and thermally "driving" the polysilicon dopants into bottom portions of the fins; (6) forming gate conductors on the sides of the fins (with the gate insulators separating the gate conductors from the fins); (7) Selectively implanting n+ and/or p+ dopants (as appropriate to the type of FinFET devices being formed: nFET and/or pFET) into top portions of the fins to form drain regions therein; (8) depositing nitride and etching back to form sidewall spacers; (9) etching back the HDP oxide to expose the underlying doped polysilicon source conductors and forming silicide in exposed portions of the source and gate conductors; (10) filling the trenches with an oxide trench-fill and planarizing via CMP (chem-mech polishing); and (11) forming metal source, drain and gate contacts by Damascene processes of selective etching, metal fill, and chem-mech polishing.

It should be noted that in the ensuing detailed description of the preferred embodiment(s) of the invention, drawing features are not necessarily to scale and should be interpreted as being merely schematically representative of the relationships between the structures and features depicted.

Figure 1:
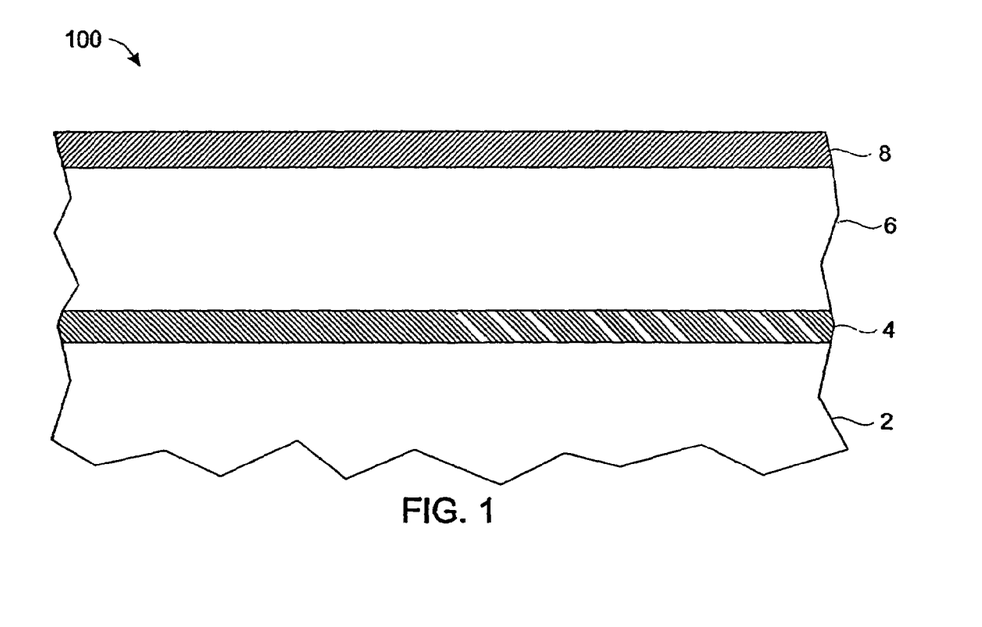
FIGS. 1-10 are cross-sectional diagrams of a vertical Fin-FET semiconductor structure on an SOI substrate at a series of sequential processing steps, in accordance with the invention.

FIG. 1 is a cross-sectional diagram of an SOI wafer substrate 100 on which n-channel and p-channel vertical FinFETs are to be formed, in accordance with the invention. Preferably, the wafer substrate structure has a bulk silicon layer 2 over which a buried oxide layer (BOX) 4 is formed. Overlying the buried oxide layer 4 is a single-crystal silicon layer 6. A nitride dielectric layer (e.g., SiN) 8 overlies the silicon layer 6. Preferably the silicon layer 6 is 50-200 nanometers (nM $-10^{-9}$ meters) in thickness, but with further device scaling, thinner layers may be appropriate.

Figure 2:
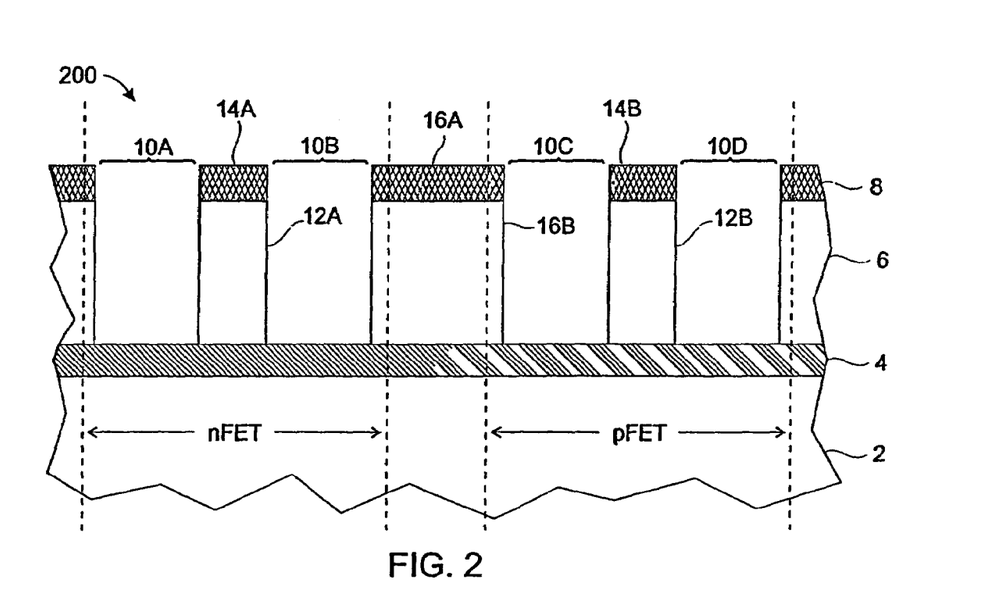

FIG. 2 is a cross-sectional diagram of a wafer substrate 200 representative of the wafer substrate 100 of FIG. 1 after etching to form well-defined, parallel trenches 10A, 10B, 10C and 10D through the nitride layer 8 and silicon layer 6 down to the BOX layer 4. Trenches 10A and 10B define a first fin 12A therebetween, which will become the body of an nFET transistor (generally indicated in the Figure as "nFET"). The first fin 12A has a nitride "cap" 14A. Trenches 10C and 10D define a second fin 12B therebetween, which will become the body of a pFET transistor (generally indicated in the Figure as "pFET"). The second fin 12B also has a nitride "cap" 14B. Trenches 10B and 10C define a spacer structure therebetween comprising a silicon base 16B with a nitride cap 16A. Preferably, the fins 12A and 12B are 10-20 nM wide, but with further device scaling, smaller widths may be appropriate. The heights of the fins 12A and 12B are equal to the thickness of the silicon layer 6, preferably 50-200 nM.

Figure 3:
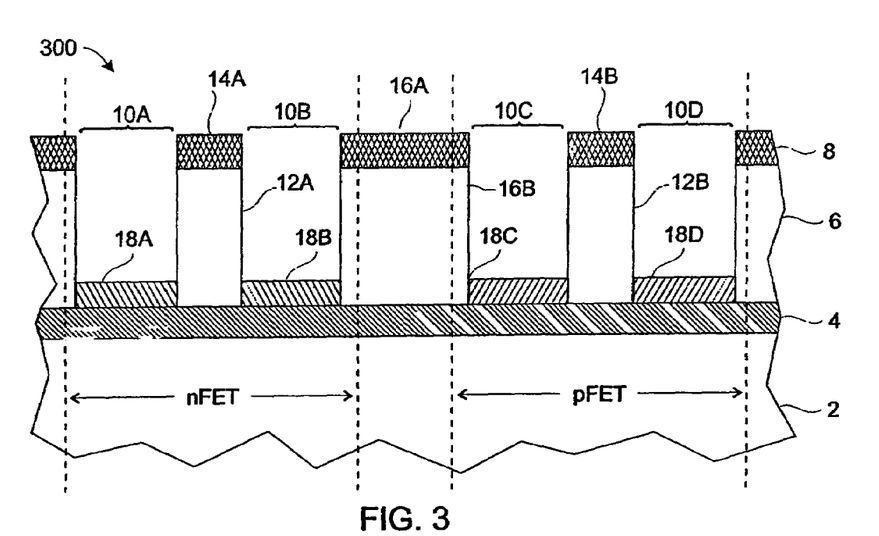

FIG. 3 is a cross-sectional diagram of a wafer substrate 300 representative of the wafer substrate 200 of FIG. 2 after a process of forming n+ doped polysilicon source conductors 18A at the bottoms of trenches 10A and 10B, respectively, and forming p+ doped polysilicon source conductors 18C and 18D at the bottoms of trenches 10C and 10D, respectively. Preferably, the source conductors 18A and 18B are formed by masking off the inchoate "pFET" device (generally indicated in the Figure as "pFET") and depositing n+ doped polysilicon in trenches 10A and 10B (generally associated with the inchoate "nFET" device generally indicated in the Figure as "nFET") and etching back such that the n+ source conductors 18A and 18B generally uniformly fill the trenches 10A and 10B to a uniform depth, contacting the fin 12A only at a bottom portion thereof. Then the mask is removed and source conductors 18C and 18D are formed in similar fashion by masking off the inchoate "nFET" device and depositing p+ doped polysilicon in trenches 10C and 10D (generally associated with the inchoate "pFET" device) and etching back such that the p+ source conductors 18C and 18D generally uniformly fill the trenches 10C and 10D to a uniform depth, contacting the fin 12B only at a bottom portion thereof. Those of ordinary skill in the art will immediately understand that the order of processing (i.e., "nFET first" as described herein where n+ source conductors 18A and 18B are formed first or or "pFET first" where p+ source conductors 18C and 18D are formed first) is not critical, and the inventive technique is readily adapted to either order of processing. Further, if only nFET devices or pFET devices are required, some intermediate steps can be eliminated.

Figure 4:
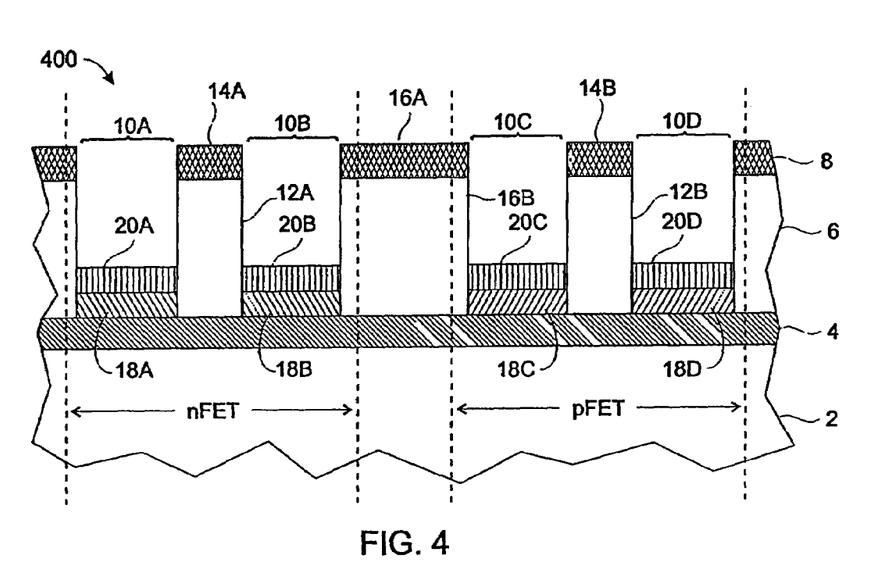

FIG. 4 is a cross-sectional diagram of a wafer substrate 400 representative of the wafer substrate 300 of FIG. 3 after forming HDP oxide layers 20A, 20B, 20C and 20D on top of source conductors 18A, 18B, 18C and 18D, respectively. Preferably, the HDP oxide layers are formed by an HDP (High-density plasma) oxide deposition process followed by a sidewall etch. Assuming that the inchoate nFET and pFET transistors (generally indicated in the Figure as "nFET" and "pFET", respectively) are part of a larger, integrated semiconductor device, those of ordinary skill in the art will immediate appreciate and understand that any required gas phase doping and/or well implantation can be performed at this point using appropriately patterned masks.

Figure 5:
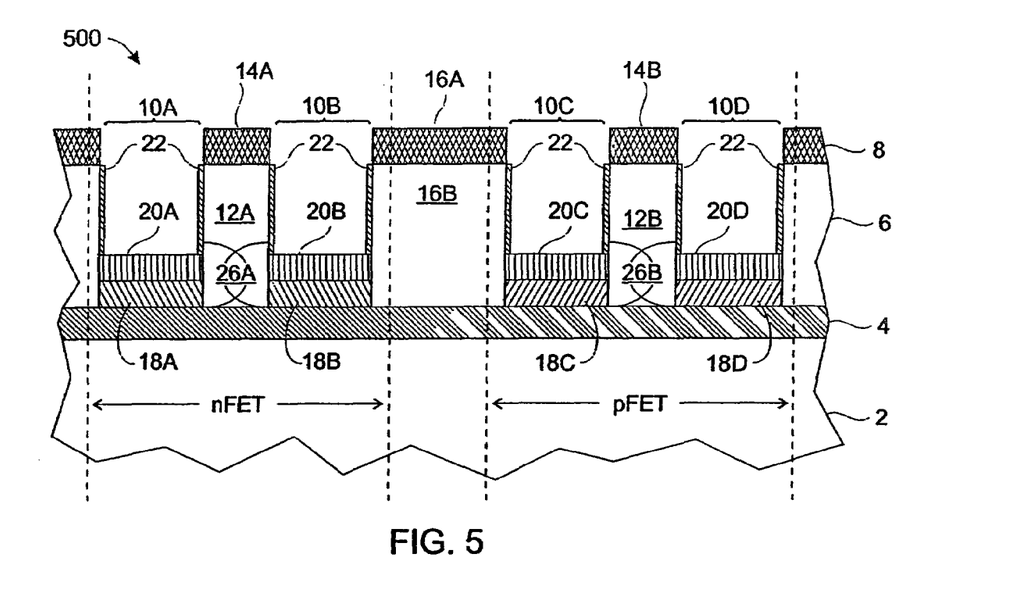

FIG. 5 is a cross-sectional diagram of a wafer substrate 500 representative of the wafer substrate 400 of FIG. 4 after forming gate insulators 22 and "driving in" source dopants from the source conductors 18A, 18B, 18C and 18D into the fins 12A and 12B to form source regions 26A and 26B, respectively, therein. Preferably, the gate insulators 22 are formed on exposed silicon sidewalls of the trenches 10A, 10B, 10C and 10D (including exposed sidewalls of the fins 12A and 12B) via a thermal oxide formation process. This same thermal process causes thermal diffusion "drive in" of the n+ source dopant in source conductors 18A and 18B into a bottom source-region portion 26A of the first fin 12A and of the p+ source dopant in source conductors 18C and 18D into a bottom source-region portion of the second fin 26B. If desired, additional heating can be employed to continue the source "drive in" thermal diffusion process. As shown in the Figure, the "driven in" source diffusion from opposite sides of the fins tends to overlap and mix (shown as overlapping curved lines in the source regions 26A and 26B). The HDP oxide layers 20A, 20B, 20C and 20D should be thin enough that the drive-in process causes the source-regions 26A and 26B to reach higher in the fins 12A and 12B than the upper surfaces of the HDP oxide layers 20A, 20B, 20C and 20D. Note that although not shown in the Figure, the source "drive-in" process will also cause diffusion into the bottom portion of the silicon base 16B of the spacer structure. Appropriate inter-device isolation will be employed at an earlier or later step to prevent this extraneous source diffusion from creating any type of cross-coupling between devices.

Figure 6:
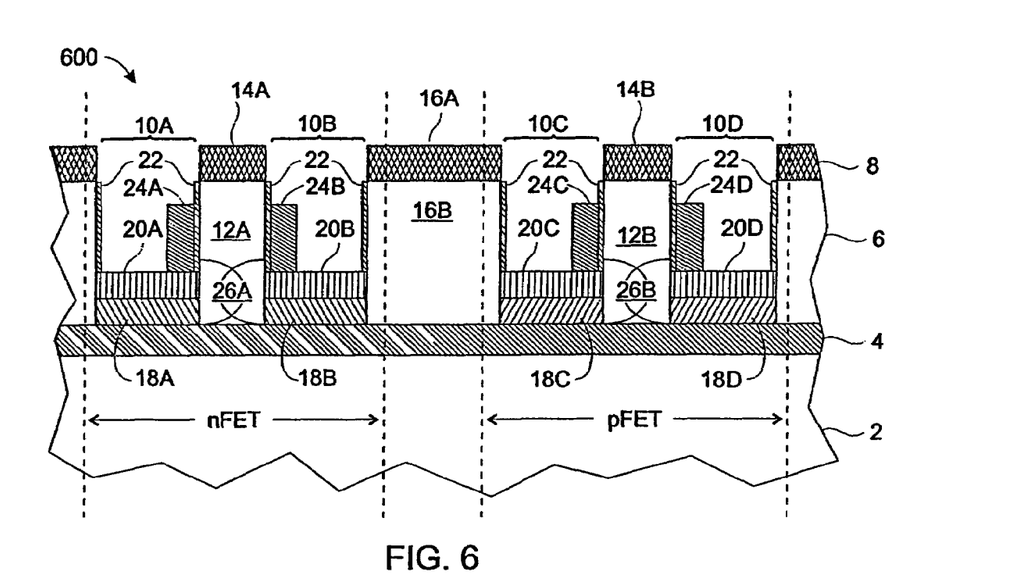

FIG. 6 is a cross-sectional diagram of a wafer substrate 600 representative of the wafer substrate 500 of FIG. 5 after forming polysilicon gate conductors 24A, 24B, 24C and 24D (gate poly). Gate conductors 24A and 24B are disposed on opposite sides of the first fin 12A (in trenches 10A and 10B, respectively, and atop HDP oxide layers 22A and 22B, respectively), in contact with the gate insulators 22, and are n+ doped. Gate conductors 24C and 24D are disposed on opposite sides of the second fin 12B (in trenches 10C and 10D, respectively, and atop HDP oxide layers 22A and 22B, respectively), in contact with the gate insulators 22, and are p+ doped. The gate conductors 24A, 24B, 24C and 24D extend vertically partway up the sides of the fins 12A and 12B. Preferably, the gate conductors 24A and 24B are created by forming a "pFET" mask that exposes only desired areas of the nFET device (generally indicated in the Figure as "nFET"), depositing n+ doped polysilicon, etching back to a suitable depth, masking the desired gate outline (nFET litho), and etching with a suitable highly directional etching process, e.g., reactive ion etching (RIE). Then a similar process can be employed to form gate conductors 24C and 24D (i.e., nFET mask, p+ gate poly deposition, etch back, pFET litho, and RIE etch).

As with the formation of the source conductors 18A-D, those of ordinary skill in the art will immediately appreciate and understand that the order of formation of the gate conductors 24A-D (i.e., n+ first or p+ first) is not critical and the inventive technique is readily adapted to suit either order.

Figure 7:
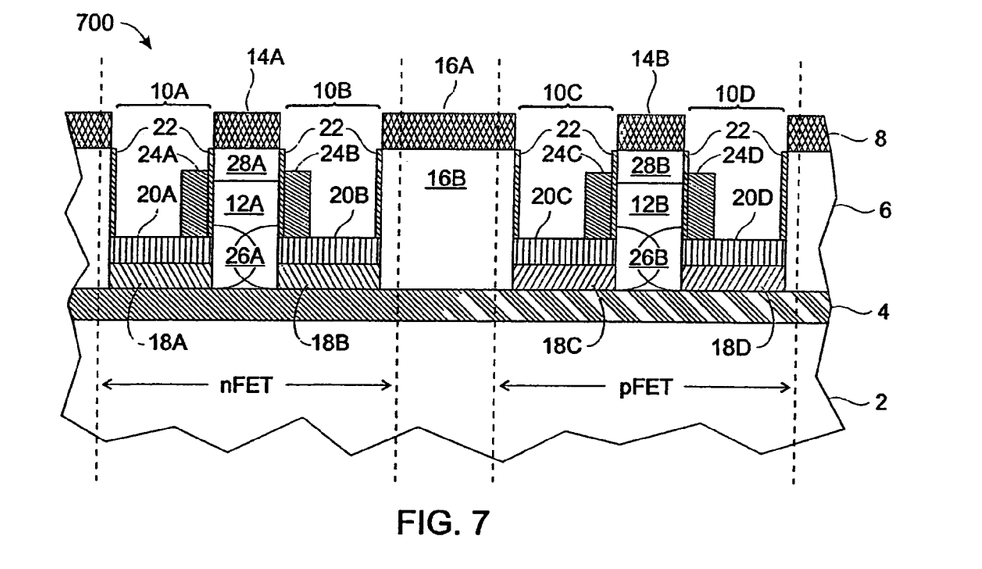

FIG. 7 is a cross-sectional diagram of a wafer substrate 700 representative of the wafer substrate 600 of FIG. 6 after implanting drain regions 28A and 28B in top portions of fins 12A and 12B. Preferably, this is accomplished by (1) masking to expose the fin 12A of the inchoate nFET device (and any other similar fin of any other nFET device(s) being simultaneously formed on a larger integrated circuit) then n+ implanting through the mask by any suitable process to form the n+ doped drain region 28A to a depth that extends slightly lower in the fin 12A than the tops of the gate conductors 24A and 24B, then (2) removing the mask and re-masking to expose the fin 12B of the inchoate pFET device (and any other similar fin of any other pFET device(s) being simultaneously formed on a larger integrated circuit) and p+ implanting through the mask by any suitable process to form the p+ doped drain region 28B to a depth that extends slightly lower in the fin 12B than the tops of the gate conductors 24C and 24D. As before, the order of processing (n+ first or p+ first) is not critical.

Figure 8:
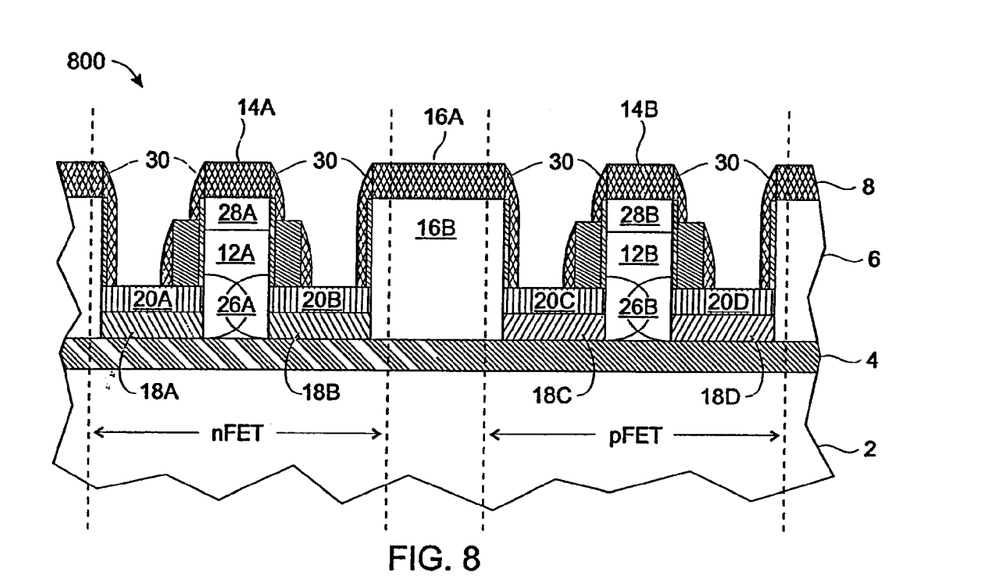

FIG. 8 is a cross-sectional diagram of a wafer substrate 800 representative of the wafer substrate 700 of FIG. 7 after forming nitride sidewall spacers 30. Preferably, the nitride spacers are formed by depositing nitride (by any suitable deposition process), then etching back such that the nitride covers all exposed vertical sidewalls, i.e., the exposed vertical sidewalls of trenches 10A, 10B, 10C and 10D, gate insulators 22, gate conductors 24A, 24B, 24C and 24D, and nitride caps 14A, 14B and 16A.

Figure 9:
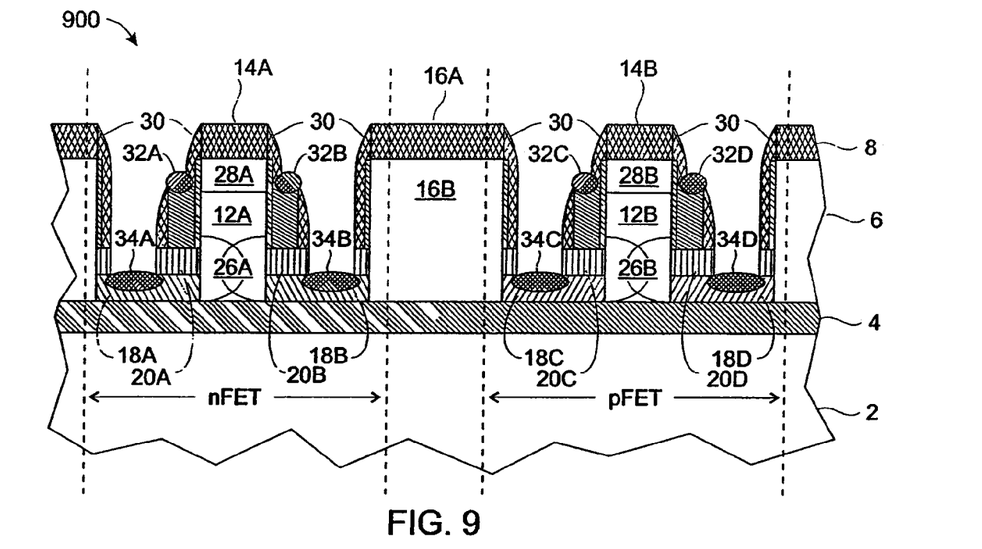

FIG. 9 is a cross-sectional diagram of a wafer substrate 900 representative of the wafer substrate 800 of FIG. 8 after the formation of silicide gate contact structures 32A, 32B, 32C and 32D; and silicide source contract structures 34A, 34B, 34C and 34D. Preferably, these silicide structures are formed by etching through exposed portions of the HDP oxide layers 20A, 20B, 20C and 20D to expose the polysilicon source conductors 18A, 18B, 18C and 18D, then performing any suitable silicidation process to form silicide gate contact structures 32A, 32B, 32C, and 32D in exposed portions of the gate conductors 24A, 24B, 24C and 24D, respectively and to form silicide source contact structures 34A, 34B, 34C and 34D in the newly exposed portions of the source conductors 18A, 18B, 18C and 18D, respectively. All silicide contact structures (32x and 34x) can be formed essentially simultaneously. Preferably, the silicide contact formation process comprises deposition of the appropriate metal for silicidation (e.g., Cobalt for formation of $CoSi_2$), silicidation by any suitable means (e.g., RTA) and removal of excess metal.

Figure 10:
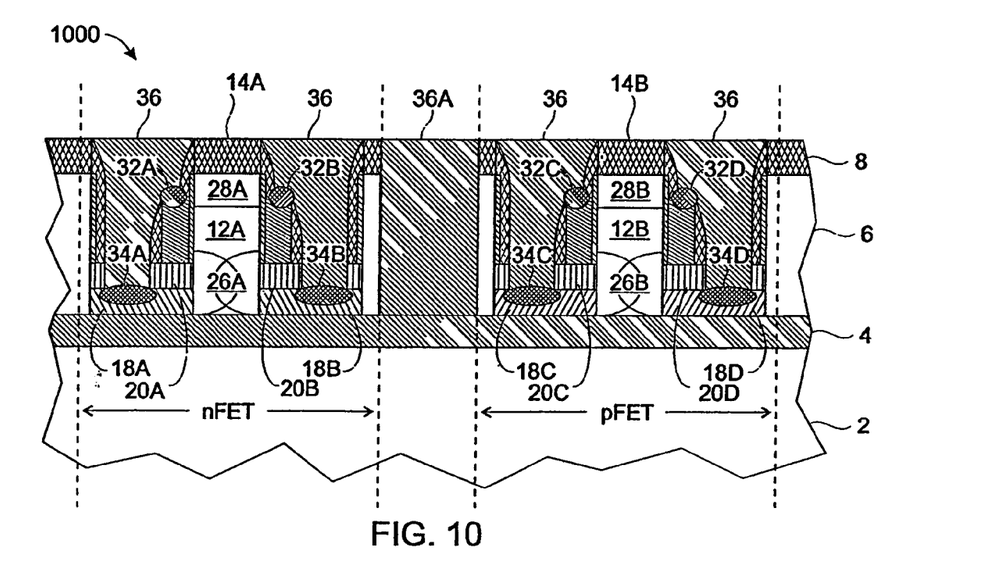

FIG. 10 is a cross-sectional diagram of a wafer substrate 1000 representative of the wafer substrate 900 of FIG. 9 after an oxide fill and planarization process. Preferably, a suitable trench-fill technique is employed to overfill the trenches 10A, 10B, 10C and 10D (see FIGS. 1-7) with oxide fill 36. The oxide fill 36 is then planarized via a CMP process.

Figure 11:
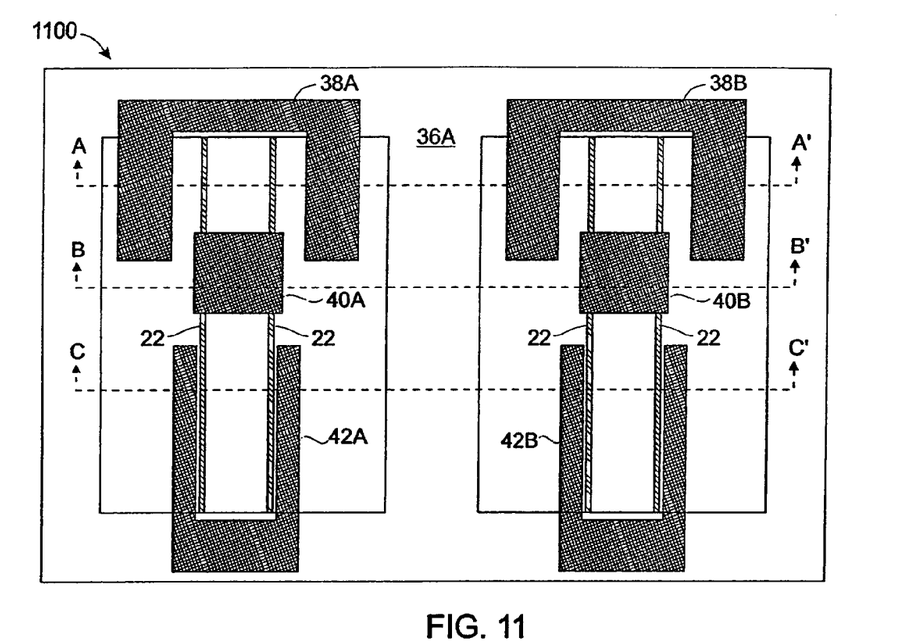
FIG. 11 is a plan view of a vertical Fin-FET semiconductor structure with source, drain and gate contacts, in accordance with the invention.

FIG. 11 is a plan view of a wafer substrate 1100 representative of the wafer substrate 1000 of FIG. 10 after formation of metal source contacts 38A and 38B, drain contacts 40A and 40B and gate contacts 42A and 42B. Preferably, the source contacts 38A and 38B and gate contacts 42A and 42B via a Damascene process whereby openings are formed in the oxide fill extending downward to corresponding silicide contact structures. The openings are filled (overfilled) with metal via a suitable metal deposition process and the metal is polished flush using CMP planarization process. The drain contacts 40A and 40B are preferably formed via a similar Damascene process whereby nitride caps 14A and 14B are selectively etched away to create openings that expose tops of the doped drain regions 28A and 28B, respectively of fins 12A and 12B, respectively. Metal deposition and CMP polishing are used in similar fashion to form the metal drain contacts 40A and 40B. At this same point, shallow trench isolation 36 is formed around each transistor device using conventional STI techniques. Note that the source contacts 38A and 38B and gate contacts 42A and 42B appear bifurcated. This is because the metal gate contact 42A connects to silicide gate contact structures 32A and 32B on both sides of the fin 12A. Similarly, gate contact 42B and source contacts 38A and 38B connect to respective silicide contact structures on both sides of their respective fins. This is shown and described in greater detail hereinbelow with respect to FIGS. 12, 13 and 14. Note that the gate contacts 42A and 42B extend only partway across their respective devices. Similarly the source contacts 38A and 38B extend only partway across their respective devices. Also note that the drain contacts 40A only extend laterally a short distance across their respective devices. This facilitates routing of subsequently formed wiring layers that connect to the devices.

Figure 12:
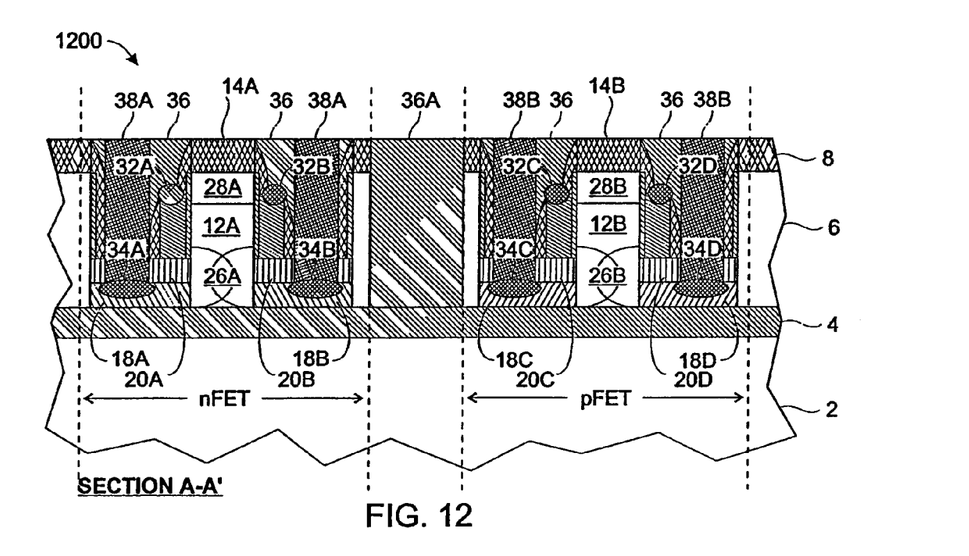
FIGS. 12-14 are different cross sectional views of the vertical Fin-FET semiconductor structure of FIG. 11, in accordance with the invention.

FIG. 12 is a cross-sectional view of a wafer substrate 1200 representative of the wafer substrate 1100 of FIG. 11 as seen when sectioned at A-A' through the source contacts 38A and 38B. In the Figure, the two legs of bifurcated source contact 38A can be seen extending downward to contact the silicide source contact structures 34A and 34B on either side of fin 12A. Similarly, the two legs of bifurcated source contact 38B are seen extending downward to contact the silicide source contact structures 34C and 34D on either side of fin 12B.

Figure 13:
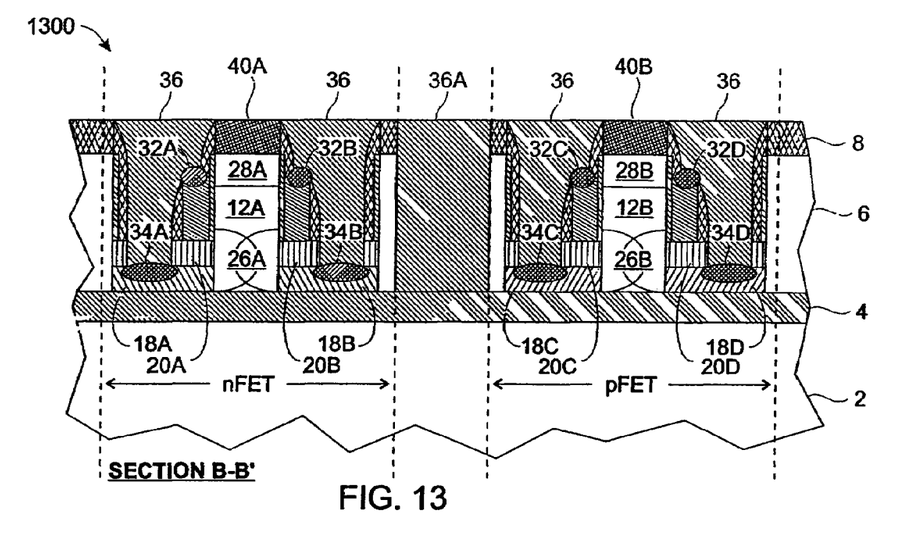

FIG. 13 is a cross-sectional view of a wafer substrate 1300 representative of the wafer substrate 1100 of FIG. 11 as seen when sectioned at B-B' through the drain contacts 40A and 40B. In the Figure, the drain contacts 40A and 40B can be seen extending downward to contact respective drain regions 28A and 28B in respective fins 12A and 12B.

Figure 14:
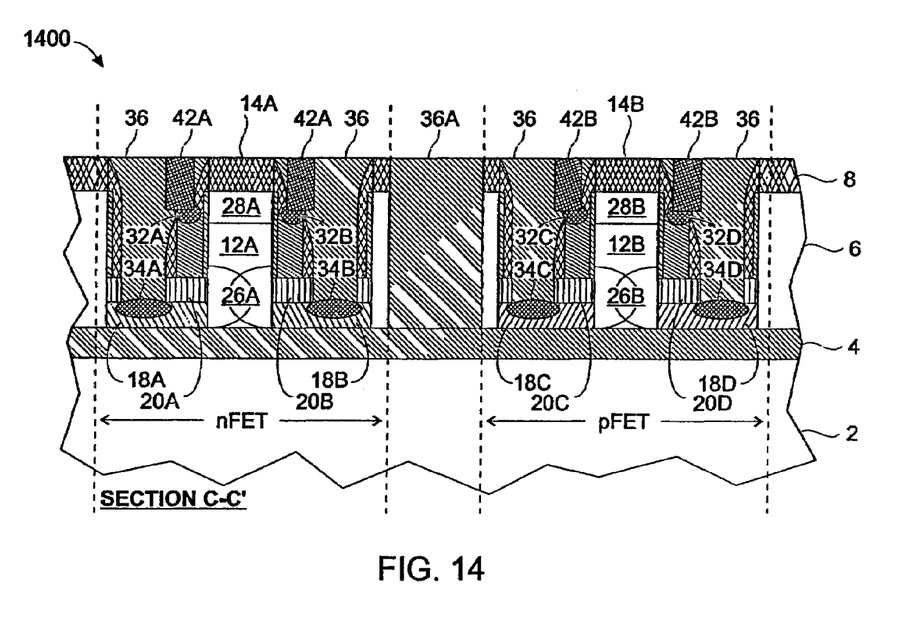

FIG. 14 is a cross-sectional view of a wafer substrate 1400 representative of the wafer substrate 1100 of FIG. 11 as seen when sectioned at C-C' through the gate contacts 42A and 42B. In the Figure, the two legs of bifurcated gate contact 42A can be seen extending downward to contact the silicide gate contact structures 32A and 32B on either side of fin 12A. Similarly, the two legs of bifurcated source contact 42B are seen extending downward to contact the silicide source contact structures 32C and 32D on either side of fin 12B.

One alternate embodiment of the inventive vertical Fin-FET device employs a "fat drain" structure that improves drain contact resistance. This is shown and described with respect to FIG. 15.

Figure 15:
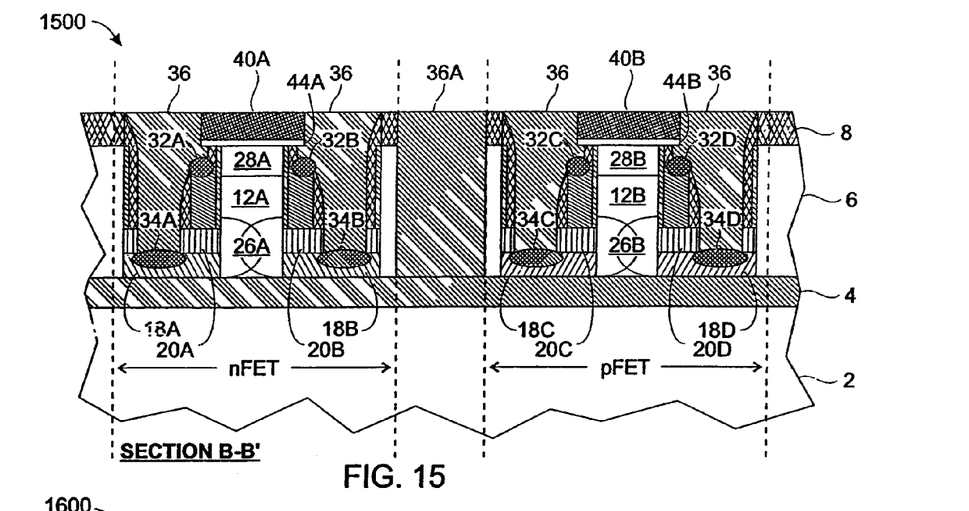
FIG. 15 is a cross-sectional view of a "fat drain" embodiment of a vertical Fin-FET semiconductor structure, in accordance with the invention.

FIG. 15 is a cross-sectional view of a wafer substrate 1500 representative of the wafer substrate 1100 of FIG. 11 as seen when sectioned at B-B' through "fat-drain" contacts 40A and 40B. In the Figure, the drain contacts 40A and 40B laterally overextend their respective fins 12A and 12B. The "fat-drain" contacts are preferably formed by masking off the desired drain contact profiles, performing a controlled nitride/oxide etch, disposing thin Si epitaxial layers 44A, 44B at the bottoms of the openings thus formed, then forming the metal drain contacts 40A and 40B by metal deposition and CMP polishing as described hereinabove.

Figure 16:
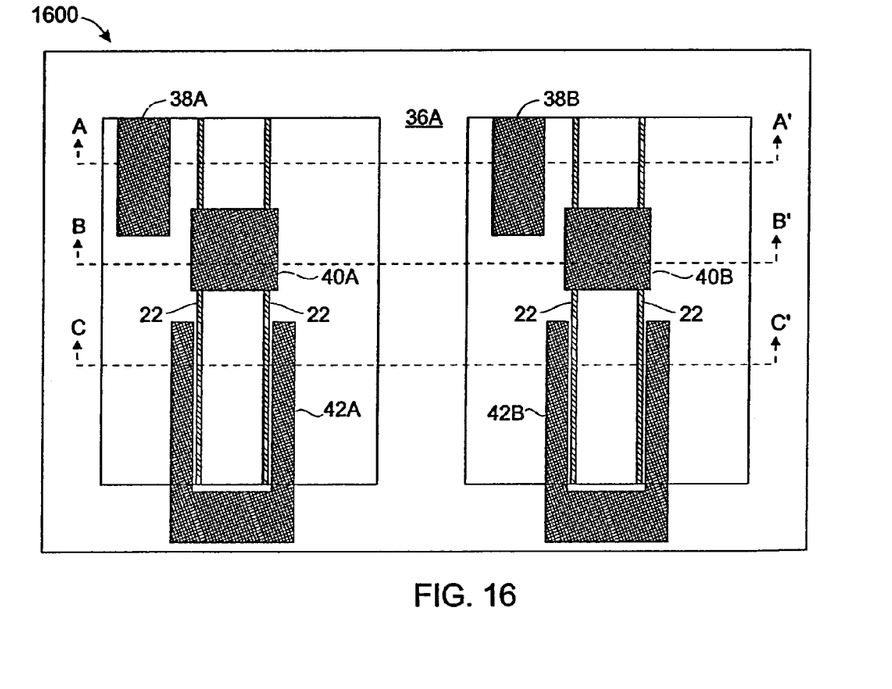
FIG. 16 is a plan view of a "single-side source" embodiment of a vertical Fin-FET semiconductor structure, in accordance with the invention.

In some applications, it may be desirable for the source contacts to connect only to one side of their respective fin. FIG. 16 is a plan view of a wafer substrate 1600 similar to the wafer substrate 1100 of FIG. 11 except that the source contacts 38A and 38B are formed on only one side of their respective fins (12A, 12B).

The gate contacts 42A and 42B are bifurcated to connect in common to silicide gate contact structures on both sides of their respective fins 12A, 12B (see FIGS. 11, 14). In some applications, it may be desirable to provide separate gate contacts to the gate conductors on each side of the Fin-FET device, thereby creating a Fin-FET with multi-gate voltage control. This is shown and described with respect to FIG. 17.

Figure 17:
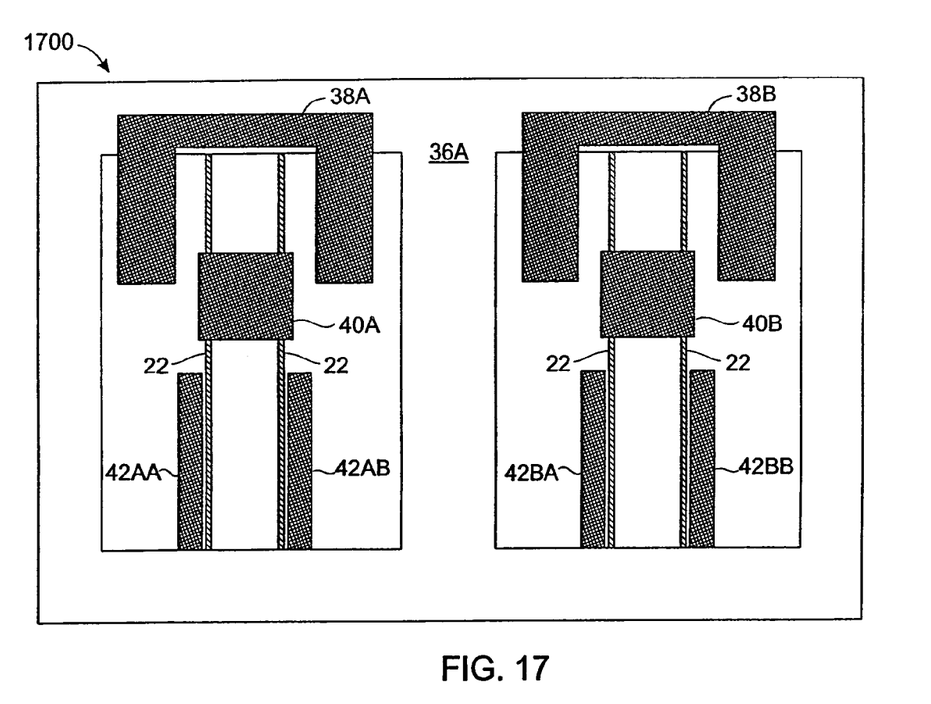
FIG. 17 is a plan view of a "multi-gate" embodiment of a vertical Fin-FET semiconductor structure, in accordance with the invention.

FIG. 17 is a plan view of a wafer substrate 1700 similar to the wafer substrate 1100 of FIG. 11 except that instead of forming bifurcated gate contacts (see 42A, 42B, FIG. 11) the legs of the gate contacts are kept separate, thereby providing separate gate contacts 42AA, 42AB, 42BA and 42BB connecting to respective silicide gate contact structures 32A, 32B, 32C and 32D (see, e.g., FIGS. 10, 14). This permits the gate contacts on each side of their respective Fin-FET devices to be controlled independently, thereby creating multi-gate vertical Fin-FETs.

In applications that require higher drive currents, multi-fin versions of the vertical Fin-Fet structure can be formed. All gate contacts are connected in parallel, all drain contacts are connected in parallel and all source contacts are connected in parallel, effectively creating an array of parallel-connected vertical fin-FETs with effective channel width multiplied by the number of fins employed, and correspondingly improved drive current capability. Connecting to "left side" and "right side" silicide gate contact structures separately creates a dual-gate version of the multi-fin vertical fin-FET. A multi-fin vertical Fin-FET device is shown and described with respect to FIG. 18.

Figure 18:
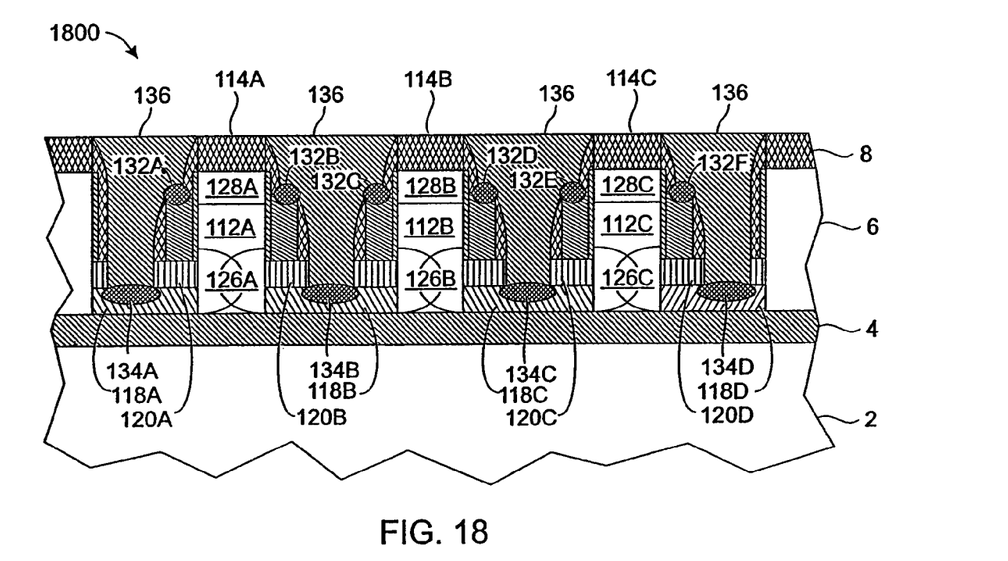
FIG. 18 is a cross-sectional view of a "multi-fin" embodiment of a vertical Fin-FET semiconductor structure, in accordance with the invention.

FIG. 18 is a cross-sectional view of a wafer substrate 1800 on which a multi-fin version of the vertical Fin-FET device has been formed prior to metal contact formation. Those of ordinary skill in the art will immediately understand that the processing steps required to create the multi-fin vertical fin-FET are essentially the same as those described hereinabove for creating single-fin devices. Three thin vertical fins 112A, 112B and 112C are formed, doped polysilicon source conductors 118A, 118B, 118C and 118D are formed alongside the fins 112A, 112B and 112C. The doping of the source conductors should be appropriate to the type of device being formed (n+ for nFET, p+ for pFET). HDP oxide insulating layers 120A, 120B, 120C and 120D are formed atop source conductors 118A, 118A, 118C, and 118D, respectively. Gate insulators, gate conductors and nitride sidewall spacers are all formed in similar fashion to that described hereinabove. Silicide gate contact structures 132A, 132B, 132C, 132D, 132E and 132F are formed in top surfaces of the gate conductors on each side of the fins 112A-112C and silicide source contact structures 134A, 134B, 134C, 134D, 134E and 134F are formed in top surfaces of the source conductors 118A, 118B, 118C, 118D, 118E, and 118F, respectively. An oxide trench fill 136 is deployed and planarized as described hereinabove. Subsequent processing steps form metal gate, source and drain contacts in similar fashion to that described hereinabove for single-fin devices.

It is generally assumed that the present inventive vertical Fin-FET device will be applied to larger CMOS (complementary MOS) circuits. It is fully within the spirit and scope of the present invention to do so. Accordingly, the descriptions hereinabove with respect FIGS. 1-17 have shown nFET and pFET devices side-by-side. Typically these devices will be part of a CMOS circuit, which may in turn be part of a larger integrated circuit device employing many such CMOS circuits. Further, individual nFET and pFET versions of the inventive vertical Fin-FET can be employed in any type of circuit (including non-complementary circuits) on an integrated device with or without other CMOS circuits. Those of ordinary skill in the art will understand that through appropriate masking, any desired combination of nFET and pFET vertical Fin-FET devices can be created.

In the description of the inventive vertical Fin-FET and its various embodiments, specific reference has been made hereinabove to "drain contacts" and "drain regions" generally located at top portions of the fins and "source contact structures", "source conductors" and "source regions" generally located at bottom portions of the fins. Those of ordinary skill in the art will understand that as with many MOS devices, the designations "source" and "drain" can be interchanged, thereby reversing the presumed direction of current flow within the transistor, although performance may or may not be identical in both directions.

Those of ordinary skill in the art will also appreciate and understand that any of the various aspects and embodiments of the inventive technique can be used alone or in combination (e.g., dual-gate, single-side source, fat drain, multi-fin, etc.). For example, a dual-gate, multi-fin device has already been described. By way of further example, the "fat drain" structure can also be employed in dual-gate and/or multi-fin variants of the vertical Fin-FET.

Processing steps as described hereinabove have generally been presented in "nFET first order" whereby nFET structures are formed first, followed by pFET structures. Those of ordinary skill in the art will immediately understand that the order of processing is not critical, and that the inventive technique is readily adapted to either order of processing. Further, if only nFET devices or pFET devices are required, some intermediate steps can be eliminated.

The vertical Fin-FET device of the present invention provides several advantages in addition to the high-density advantages that derive from its vertical orientation. The "double-gate" feature is an inherent feature of the device and provides a significant advantage in offering improved drive current. Drive current can be further enhanced by creating multiple-fin versions of the vertical Fin-FET as described hereinabove with respect to FIG. 18. The same process steps can be used to create both single-fin and multi-fin devices, so there is no processing penalty in mixing them on a single integrated circuit device.

The present invention has been described hereinabove specifically with respect to silicon-based semiconductor technology. Those of ordinary skill in the art will immediately understand that similar techniques can be employed to produce equivalent structures having vertically oriented transistor "fin" bodies with vertical current flow using other semiconductor technologies. The description in terms of silicon-based semiconductor technology hereinabove should be viewed as exemplary rather than limiting.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A vertical Fin-FET semiconductor device characterized by:

At least one vertical semiconductor fin (12A) disposed on an insulator layer (4);

Doped source (26A) and drain regions (28A) in bottom and top portions of the at least one semiconductor fin (12A); and Gate conductors (24A, 24B) disposed along vertical sidewalls of the at least one semiconductor fin (12A) and separated therefrom by thin gate insulators (22);

Source conductors (18A, 18B) contacting the source region (26A) on opposite sides of the at least one semiconductor fin (12A);

At least one source contract (38A) connecting to at least one source conductor (18A, 18B);

At least one drain contact (40A) connecting to the drain region (28A) of the at least one semiconductor fin (12A);

A vertical channel region in the fin (12A) between the source region (26A) and the drain region (28A); and At least one gate contact (42A) connection to at least one gate conductor (24A, 24B).

2. A vertical Fin-FET device according to claim 1; wherein the at least one gate contact (42A) connects to two gate conductors (24A, 24B) on opposite sides of the same fin (12A).

3. A vertical Fin-FET device according to claim 1, further characterized by:
two gate contacts (42AA, 42BB), distinct from one another and each connecting to a respective gate conductor (24A, 24B) on opposite sides of the same fin (12A).

4. A vertical Fin-FET device according to claim 1, wherein the at least one drain contact (40A) connects to at least two source conductors (18A, 18B) on opposite sides of the same fin (12A).

5. A vertical Fin-FET device according to claim 1, wherein the gate conductors (24A, 24B) span a vertical distance between the source and drain regions (26A, 28A) in the at least one fin (12A).

6. A vertical Fin-FET device according to claim 1, further characterized by at least two vertical fins (112A, 112B FIG. 18).

7. A vertical Fin-FET device according to claim 1, wherein the at least one drain contact (40A, FIG. 15) laterally overextends the at least one fin (12A).

8. A vertical Fin-FET device according to claim 1, wherein:
the source conductors (18A, 18B) are n+ doped;
the gate conductors (24A, 24B) are n+ doped;
the source and drain regions (26A, 26B) are n+ doped; and
the channel is the fin (12A) p$^-$ doped or intrinsic.

9. A vertical Fin-device according to claim 1, wherein:
the source conductors (18A, 18B) are p+ doped;
the gate conductors (24A, 24B) are p+ doped;
the source and drain regions (26A, 26B) are p+ doped;
the vertical Fin-FET device is an pFET device; and
the channel is the fin (12A) p$^-$ doped or intrinsic.

10. A vertical Fin-FET device according to claim 1, wherein the insulator layer (4) is a buried oxide layer (BOX) of a SOI substrate.

11. A vertical Fin-FET device according to claim 1, wherein the vertical Fin-FET device is part of a CMOS circuit.

12. A vertical Fin-FET device according to claim 1, wherein the vertical Fin-FET device is part of an integrated circuit device.

13. A vertical Fin-FET device according to claim 1, wherein in the channel region, channels form adjacent to the gate insulators (22) and extending between the source region (26A) and drain region (28A) in response to a bias voltage applied to the gate conductors (24A, 24B).

14. A vertical Fin-FET device characterized by:
a thin vertical silicon fin (12A) formed in a silicon layer (6) of an SOI substrate;
doped source and drain regions (26A, 28A) formed in bottom and top portions, respectively, of the fin;
a pair of gate conductors (24A, 24B) disposed along opposite vertical sidewalls of the fin (12A), separated from the fin by thin gate insulators (22) and spanning a vertical distance between the source and drain regions (26A, 26B);
a pair of source conductors (18A, 18B) disposed alongside of and in contact with the source region (26A) on opposite sides of the fin (12A);
a drain contact (40A) connecting to the drain region (28A);
a source contact (38A) connecting to the source conductors (18A, 18B); and
at least one gate contact (42A) connecting to at least one gate conductor (24A).

15. A vertical Fin-FET device according to claim 13, wherein the at least one gate contact (42A) connects to both gate conductors (24A, 24B).

16. A vertical Fin-FET device according to claim 14, wherein:
the at least one gate contact (42AA) connects to one gate conductor (24A); and
a second gate contact (42AB) connects to another gate conductor (24B) on the opposite side of the same fin (12A).

17. A vertical Fin-FET device according to claim 14, wherein:
the drain contact (40A, FIG. 15) laterally overextends the fin 12A.

18. A vertical Fin-FET device according to claim 14, wherein:
the at least one gate contact (42A) connects to the at least one gate conductor (24A) via a respective silicide gate contact structure (32A, 32B); and
the source contact (38A), connects to the source conductors (18A, 18B) via silicide source contact structures 34A, 34B.

19. A method of forming a vertical Fin-FET device, characterized by the steps of:
providing a semiconductor substrate having a semiconductor layer (6) disposed over an insulator layer (4);
forming vertical semiconductor fins (12A) on top of the insulator layer (4) by etching parallel trenches (10A, 10B) through the semiconductor layer down to the insulator layer (4);
selectively depositing doped conductors (18A, 18B) at the bottoms of the trenches (10A, 10B) such that the doped source conductors contact bottom portions of the fins;
forming source insulators (20A, 20B) over the doped conductors (18A, 18B);
forming gate insulators (22) along sidewalls of the trenches;
thermally driving dopants from the doped conductors into bottom portions of the fins (12A) to form source regions (26A) in the fins (12A);
forming gate conductors (24A, 24B) along vertical sidewalls of the fins (12A), spaced away therefrom by the gate insulators (22);
doping top portions of the fins (12A) to form drain regions (28A) therein;
forming sidewall spacers (30) along exposed sidewalls of the trenches (10A, 10B), fins (12A) and gate conductors (24A, 24B);
etching back the source insulators to expose the underlying doped source conductors;
forming silicide in exposed portions of the source and gate conductors;
filling the trenches with an oxide trench-fill and planarizing; and forming metal source, drain and gate contacts by Damascene processes of selective etching, metal fill, and chem-mech polishing.

20. A method of forming a vertical Fin-FET device according to claim 19 wherein the steps of forming source regions (26A) and drain regions (28A) effectively form channel regions in the fins (12A) extending between the source regions (26A) and drain regions (28A).

21. A method of forming a vertical Fin-FET device according to claim 19 wherein the semiconductor substrate is a silicon-on-insulator (SOI) substrate.

* * * * *